(12) United States Patent
Bakija et al.

(10) Patent No.: US 10,134,608 B2
(45) Date of Patent: Nov. 20, 2018

(54) POWER ELECTRONIC SWITCHING DEVICE AND POWER SEMICONDUCTOR MODULE THEREWITH

(71) Applicant: SEMIKRON ELEKTRONIK GMBH & CO. KG, Nuremberg (DE)

(72) Inventors: Nedzad Bakija, Nürnberg (DE); Christian Göbl, Nürnberg (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 0 days.

(21) Appl. No.: 15/649,999

(22) Filed: Jul. 14, 2017

(65) Prior Publication Data

US 2018/0019138 A1    Jan. 18, 2018

(30) Foreign Application Priority Data

Jul. 18, 2016 (DE) .......................... 10 2016 113 152

(51) Int. Cl.
*G05F 1/56* (2006.01)
*H01L 21/52* (2006.01)
(Continued)

(52) U.S. Cl.
CPC ............ *H01L 21/52* (2013.01); *H01L 23/051* (2013.01); *H01L 23/3121* (2013.01);
(Continued)

(58) Field of Classification Search
CPC ................................ G05F 1/56; H02M 3/1588
(Continued)

(56) References Cited

U.S. PATENT DOCUMENTS 6,801,028 B2 * 10/2004 Kernahan ............. H02M 3/156
                                                                    323/283
2005/0052167 A1 * 3/2005 Paul ...................... H01L 23/645
                                                                    323/282
(Continued)

FOREIGN PATENT DOCUMENTS

DE           196 12 514        5/1997
DE       10 2006 006 424       8/2007
(Continued)

OTHER PUBLICATIONS

DE 10 2016 113 152.0, German Examination Report dated Mar. 13, 2017, 6 pages—German, 3 pages—English.

*Primary Examiner* — Adolf Berhane
*Assistant Examiner* — Nusrat Quddus
(74) *Attorney, Agent, or Firm* — Lackenbach Siegel, LLP; Andrew F. Young

(57) ABSTRACT

A switching device and a power semiconductor module are configured with a substrate, a power semiconductor component arranged thereupon and with a load connection device. The substrate incorporates mutually electrically-insulated printed conductors and wherein the load connection device, preferably for an AC potential, comprises at least two partial connection devices, having mutually corresponding contact surfaces and being interconnected in an force-fitted or materially-bonded manner and, on the contact surfaces, an electrically conductive manner, wherein a first partial connection device has a first contact device, which is force-fitted or materially-bonded to the printed conductor of the substrate, and wherein a second partial connection device has a second contact device for the further, preferably external, connection of a load connection device.

9 Claims, 2 Drawing Sheets

(51) Int. Cl.
  *H01L 23/31* (2006.01)
  *H01L 23/498* (2006.01)
  *H01L 25/18* (2006.01)
  *H02M 3/158* (2006.01)
  *H01L 23/051* (2006.01)
  *H02M 1/00* (2006.01)

(52) U.S. Cl.
  CPC ........ *H01L 23/49838* (2013.01); *H01L 25/18* (2013.01); *H02M 3/1588* (2013.01); *H02M 2001/0058* (2013.01)

(58) Field of Classification Search
  USPC .......................................... 323/282–289, 315
  See application file for complete search history.

(56) References Cited

U.S. PATENT DOCUMENTS

| | | | |
|---|---|---|---|
| 2009/0066300 A1* | 3/2009 | Lotfi | ................... H01F 17/0033 323/247 |
| 2009/0066468 A1* | 3/2009 | Lotfi | ..................... H01F 10/132 336/233 |
| 2010/0123240 A1 | 5/2010 | Sato et al. | |
| 2010/0141229 A1* | 6/2010 | Satou | ................ H01L 23/49575 323/282 |
| 2011/0121448 A1 | 5/2011 | Tsukada et al. | |

FOREIGN PATENT DOCUMENTS

| | | |
|---|---|---|
| DE | 10 2009 024 385 | 12/2010 |
| DE | 10 2013 200 526 | 7/2014 |
| DE | 10 2013 113 143 | 5/2015 |
| JP | 2002353407 | 12/2006 |

\* cited by examiner

POWER ELECTRONIC SWITCHING DEVICE AND POWER SEMICONDUCTOR MODULE THEREWITH

CROSS REFERENCE TO RELATED APPLICATIONS

This application relates to, and claims priority from, DE Ser. No. 10 2016 113 152.0 filed Jul. 18, 2016, the entire contents of which are incorporated herein by reference.

FIGURE SELECTED FOR PUBLICATION

FIG. 3

BACKGROUND OF THE INVENTION

Field of the Invention

The invention describes a power electronic switching device having at least one substrate, at least one power semiconductor component arranged thereupon and having a load connection device for the further, specifically external connection of a power semiconductor module with said switching device.

Description of the Related Art

The configuration of general power semiconductor modules with at least one substrate is known from the generally known prior art. Power semiconductor components are arranged hereupon, and are bonded internally to form a circuit, for example by means of wire bonds. For external connection, power semiconductor modules of this type are provided with a plurality of load connection devices, which are customarily configured as planar metallic mouldings, which are bonded with the substrate in an electrically conductive manner. These load connection devices are further provided with a contact device for the external connection of the power semiconductor module.

Disadvantageously, in many cases, material requirements, specifically with respect to hardness, for the contacting of the respective load connection element with the substrate are different to those governing external connection. For example, for the bonding of the load connection element to the substrate by welding, a material of lower hardness is required than is appropriate for an external connection, which is generally configured as a screwed connection.

ASPECTS AND SUMMARY OF THE INVENTION

In consideration of the aforementioned circumstances, one alternative aspect and object of the invention is the disclosure of a power electronic switching device and a power semiconductor module therewith, each having a load connection device which is optimally adapted to the respective requirements.

According to the invention, this aspect and object is fulfilled by a power electronic switching device having the characteristics described herein, and by a power semiconductor module having the characteristics described herein. Preferred forms of embodiment are described in the relevant claims but are not limited thereto.

The power electronic switching device according to the invention is configured with a substrate, a power semiconductor component arranged thereupon and with a load connection device, wherein the substrate incorporates mutually electrically-insulated printed conductors, wherein the load connection device, preferably for an AC potential, comprises at least two partial connection devices, having mutually corresponding contact surfaces and being interconnected in an force fitted or materially-bonded and, on the contact surfaces, an electrically conductive manner, wherein a first partial connection device has a first contact device, which is force-fitted or materially-bonded to the printed conductor of the substrate, and wherein a second partial connection device has a second contact device for the further, preferably external, connection of a load connection device.

Preferably, at least one of the materially-bonded connections is configured as a preferably customary adhesive, soldered, sintered or welded joint, wherein the term welded joints shall also be understood to include laser-welded joints and laser-assisted welded joints. Specifically, it is advantageous if the surface to which laser radiation is applied has a roughness which results in the absorption of at least 10%, and specifically at least 25% of the laser radiation.

It is likewise preferred if at least one of the force-fitted connections is configured as a preferably customary clinched, riveted, clamped or screwed connection.

It is particularly advantageous if the first partial connection device has a hardness, on the Vickers hardness scale, which is at least 3 grades, preferably at least 5 grades, preferably at least 10 grades, but preferably no more than 25 grades lower than the hardness of the second partial connection device. It is understood that Vickers hardness is measured by the standard method for the determination thereof. Specifically, it is advantageous if the first partial connection device has a hardness of 30 HV to 60 HV, and the second partial connection device has a hardness of 50 HV to 90 HV.

Advantageously, the first or second or both partial connection devices are comprised of copper or aluminum, or of an alloy which is primarily composed of one of the two metals, i.e. to a proportion of over 80 percent by mass.

Moreover, the first or second or both partial connection devices can preferably incorporate slot-type recesses for targeted current conduction or current balancing, specifically where a plurality of substrates are provided.

According to the invention, the power semiconductor module is configured with an aforementioned electronic switching device and with a housing, wherein the second partial connection device projects from the housing through a recess in the latter, where the second contact device is arranged.

Firstly, it can be preferred if the power semiconductor module has a baseplate, upon which the substrate is arranged, and is enclosed by the housing. Secondly, it can also be preferred if the power semiconductor module is configured for arrangement on a cooling system, and the substrate is enclosed by the housing.

Naturally, if this is not excluded per se, characteristics specified in the singular, specifically the substrate and the power semiconductor component, and the load connection device, can be provided in the plural in the respective power electronic switching device or power semiconductor module.

It is understood that the various configurations of the invention can be executed individually or in optional combinations, in order to achieve improvements.

Specifically, the characteristics specified and described heretofore and hereinafter, regardless of whether they are specified in the context of the power electronic switching device or in that of the power semiconductor module, can not only be employed in the combinations indicated, but also in other combinations or in isolation, without departing from the scope of the present invention.

Further clarifications of the invention, advantageous details and characteristics proceed from the following description of the exemplary embodiments represented in FIGS. 1 to 4.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
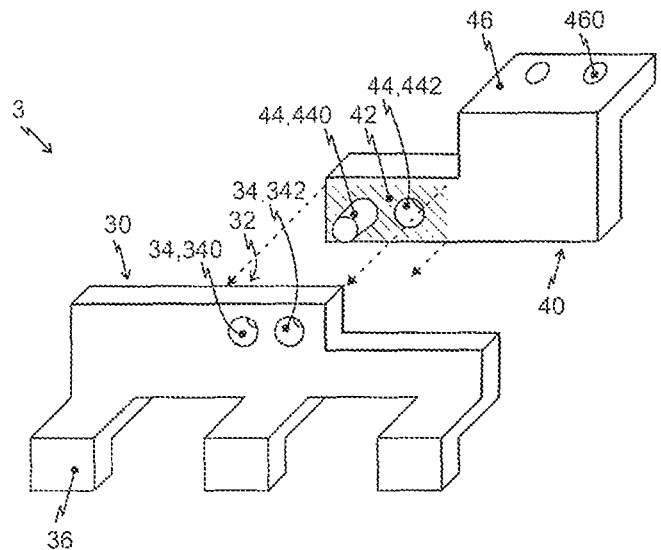
FIG. 1 shows a three-dimensional exploded view of a load connection device of a switching device according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

Although only a few embodiments have been disclosed in detail above, other embodiments are possible and the inventors intend these to be encompassed within this specification. The specification describes certain technological solutions to solve the technical problems that are described expressly and inherently in this application. This disclosure describes embodiments, and the claims are intended to cover any modification or alternative or generalization of these embodiments which might be predictable to a person having ordinary skill in the art.

Those of skill would further appreciate that the various illustrative blocks, modules, circuits, described in connection with the embodiments disclosed herein may be implemented as electronic hardware on a specific purpose machine without departing from the scope and spirit of the present invention.

FIG. 1 shows a three-dimensional exploded view of a load connection device 3 of a switching device according to the invention. In this case, this load connection device 3 is comprised of two partial connection devices 30, 40, wherein the first partial connection device 30, without loss of generality, is provided here with a plurality of three first contact devices 36 (but the invention is not limited thereto) for the formation of an electrically conductive bond with a substrate. On substrates of this type, printed conductors are arranged, upon which at least one power semiconductor component is arranged and is connected to form a circuit. Consequently, contact with the substrate is understood to include indirect or direct electrical contact with the power semiconductor component. Direct contact with a contact surface of the power semiconductor component can also exist, in the absence of any contact of the first contact device with a printed conductor for this purpose.

In this case, the first partial connection device 30 is configured as a copper moulding formed by stamping-and-bending technology, with a surface coating, having a material thickness of 4 mm. The copper of the first partial connection device 30 has a Vickers hardness of 50 HV. The first partial connection device 30 moreover comprises a first contact surface 32 for the mechanical and electrically conductive bonding with the second partial connection device 40.

In this case, the second partial connection device 40 is configured as a copper moulding formed by stamping-and-bending technology, with a surface coating, having a material thickness of 6 mm. The copper of the second partial connection device 40 has a Vickers hardness of 65 HV. The second partial connection device 40 moreover comprises a second contact surface 42 for the mechanical and electrically conductive bonding with the corresponding first contact surface 32 of the first partial connection device 30.

For the connection 34, 44 of the two partial connection devices 30, 40, two variants are represented here. Firstly, the second partial connection device 40, in the planar region of the second contact surface 42, is provided with a metal pin 440, which penetrates a corresponding recess 340 in the first partial connection device 30, and is thus configured to form a riveted connection. Secondly, the first and second partial connection devices 30, 40, likewise in the planar region of the contact surfaces 32, 42, incorporate mutually-associated recesses 342, 442, which are configured to accommodate a screwed connection.

Figure 3:
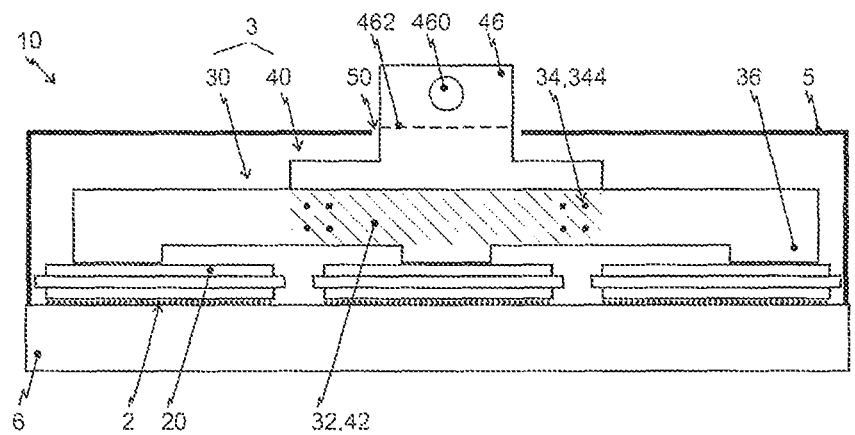
FIG. 3 shows a first power semiconductor module according to the invention.
Figure 4:
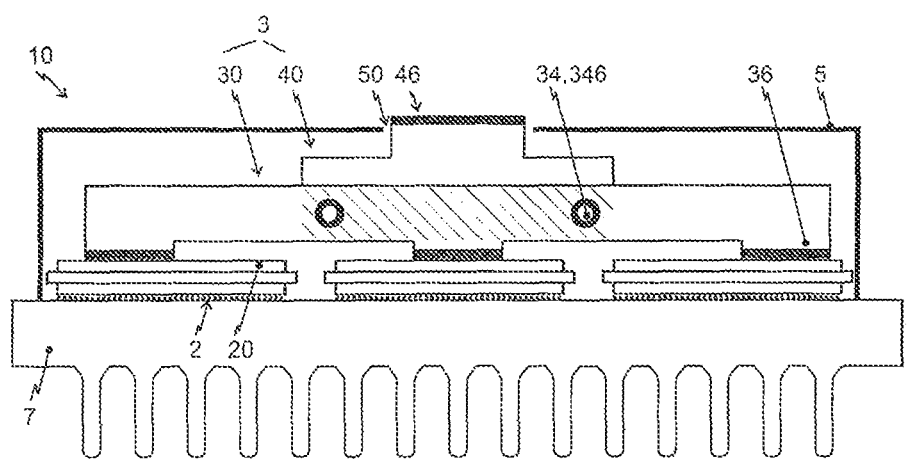
FIG. 4 shows a second power semiconductor module according to the invention.

The second partial connection device 40 moreover has a second contact device 46, which serves as a further connection of a load connection device, c.f. FIGS. 3 and 4. In this case, this second contact device 46 incorporates two recesses 460, configured as through-holes, for the passage of screws to form a screwed connection. This configuration is customary for load connection devices of power semiconductor modules.

Figure 2:
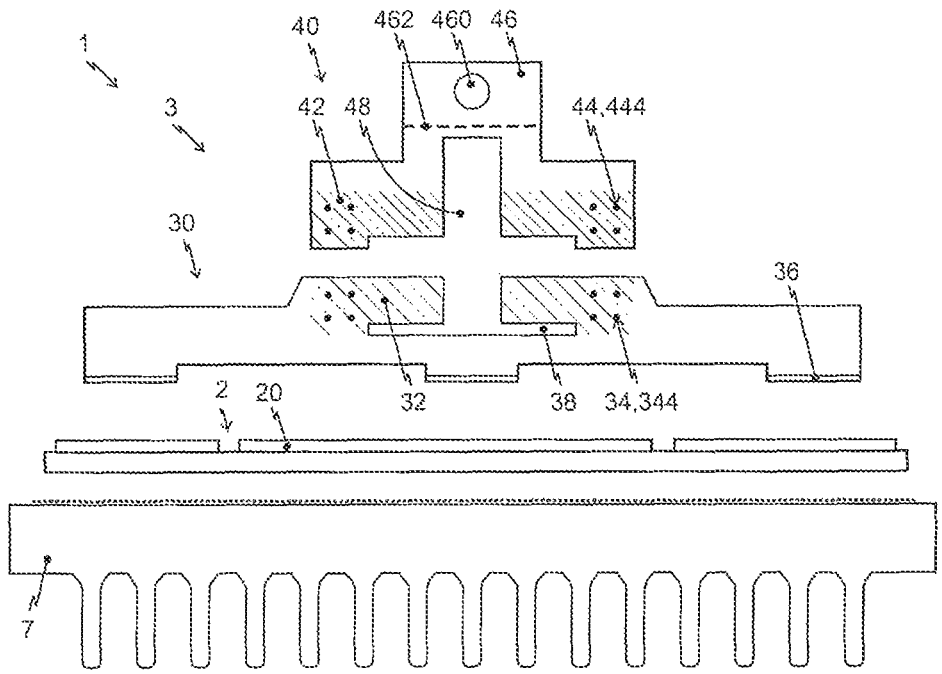
FIG. 2 shows an exploded view of a switching device according to the invention, and the arrangement thereof on a cooling system.

FIG. 2 shows an exploded view of a switching device 1 according to the invention, and the arrangement thereof on a cooling system 7. In this case, the switching device 1 has a customary substrate 2, fundamentally of the type already described above, with three printed conductors 20 wherein, in the interests of clarity, no power semiconductor components and no internal connection devices are represented. In this configuration, the substrate 2 is arranged directly on a cooling system 7, where applicable with the interposition of a thermally-conductive intermediate layer.

The load connection device 3 is in turn comprised of two partial connection devices 30, 40, wherein the first partial connection device 30 has three first contact devices 36 for electrically conductive bonding with the three printed conductors 20 of the substrate 2. The first contact devices 36 are materially bonded to the printed conductors 20 by means of a welded connection. The first partial connection device 30 also has on its reverse side, which is not visible in practice hut is nevertheless represented in the interests of clarifying the invention, a first contact surface 32 for the formation of an electrically conductive bond with a corresponding second contact surface 42 of the second partial connection device 40.

This second partial connection device 40 has a bending edge 462 and, adjacently thereto, a region of a second contact device 46 having a recess 460. The second partial connection device 40 is inclined away from this bending edge 462, according to the arrangement in a power semiconductor component, c.f. FIGS. 3 and 4.

In this case, the two partial connection devices 30, 40 are mechanically interconnected in a materially-bonded manner by means of a laser-welded joint 344, 444 in the region of the corresponding contact surfaces 30, 42. These contact surfaces 30, 42 simultaneously serve to form the electrically conductive bond 34, 44 between the two partial connection devices 30, 40, and thus the current flow between the first contact devices 36 of the first partial connection device 30 and the second contact device 46 of the second partial connection device 40.

The first partial connection device 30 moreover has a T-shaped recess 38 which, in this case, but not necessarily, is arranged in the region of the first contact surface 32 and above the central first contact device 36. The function of this recess 38 is current conduction, specifically in this case the central extension of the current path from the first contact device 36 to the second partial connection device 40. In asymmetrical configurations of the first partial connection device, slots of this type can also execute a current balancing function in the current path of the individual first contact devices. This T-shaped recess 38 in the first partial connection device 30 is associated with a corresponding recess 48 in the second partial connection device 40, wherein these recesses 38, 48 cooperate in the manner described, and determine the current path from or to the central first contact device.

FIG. 3 shows a first power semiconductor module 10 according to the invention, without loss of generality, having three substrates 20 which are arranged on a baseplate 6, by means of a soldered connection, and a housing 5 which is likewise arranged on the baseplate 6 and encloses the substrates 2. Also represented is a load connection device 3, consisting of two partial connection devices 30, 40, which are fundamentally configured as described with reference to FIG. 2, but without the slot-type recesses for current conduction.

In this case, the three first contact devices 36 of the first partial connection device 30 are bonded to the printed conductors 20 of the substrate 2 by soldering. The second partial connection device 40 projects through a recess 50 in the housing 5, and projects therefrom to the exterior, where the second contact device 46 thereof is arranged which, in this representation, is not yet inclined along a bending edge 462.

Moreover, in the interests of the clarification of the invention, the corresponding contact surfaces 32, 42 of the first and second partial connection devices 30, 40 which, in practice, are not visible in this view, are represented. On these contact surfaces 32, 42, again by means of laser welding 344, a mechanical connection 34 and thus an electrically conductive contact between the partial connection devices 30, 40 is configured.

FIG. 4 shows a second power semiconductor module 10 according to the invention, which essentially corresponds to that represented in FIG. 3. By way of distinction, in this case, the bonds between the first contact devices 36 and the printed conductors 20 of the substrate 2 are configured respectively as pressure-sintered connections. In this case, the connection 34 between the two partial connection devices 30, 40 is configured by means of a clinched joint 346. The basic functionality of the respective connection, however, is not altered by the configuration thereof.

This power semiconductor module 10 is a baseplate-free module, wherein the substrates 2 are customarily arranged directly on a cooling system 7, with the interposition of a thin, thermally-conductive intermediate layer, and are enclosed by the housing 5.

Moreover, the second partial connection device 40 is inclined at the bending edge 462 thereof represented in FIG. 3, such that the contact device 46 is oriented here in the drawing planes as shown, but is not limited thereto.

It will be understood by those of skill in the art that the physical arrangements, bending angles, extensions, and other structure do not limit the invention which is defined in the claims. The claimed structures and arrangements may be embodied with alternative structures without departing from the scope and spirit of the present invention.

The unit of hardness discussed as 'Vickers Hardness' is given by the test is known as the Vickers Pyramid Number (HV). The hardness number can be converted into units of pascals, but should not be confused with pressure.

Also, the inventors intend that only those claims which use the words "means for" are intended to be interpreted under 35 USC 112, sixth paragraph. Moreover, no limitations from the specification are intended to be read into any claims, unless those limitations are expressly included in the claims.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power electronic switching device, comprising:
   a substrate, a power semiconductor component arranged thereupon and having a load connection device;
   the substrate incorporating a plurality of mutually electrically-insulated printed conductors;
   the load connection device further comprising:
   at least a first and a second partial connection device, having mutually corresponding contact surfaces and being interconnected by at least one of a force-fitted interconnection and a materially-bonded interconnection on portions of the contact surfaces in an electrically conductive manner;

wherein at least said first partial connection device has a first contact device which is connected by at least one of a force-fitting and a materially-bonding to the printed conductor of the substrate;

wherein a second partial connection device has a second contact device for a further connection of an external load connection device; and wherein the at least first partial connection device has a hardness, on a Vickers hardness scale (HV), which is at least 3 grades lower than the hardness of the second partial connection device.

2. The power electronic switching device, according to claim 1, wherein:

at least one of the materially-bonded connections is configured to include at least one of an adhesive joint, a soldered joint and a welded joint.

3. The power electronic switching device, according to claim 1, wherein:

at least one of the force-fitted connections is configured to include at least one of a clinched connection, a riveted connection, a clamped connection and a screwed connection.

4. The power electronic switching device, according to claim 1, wherein:

the at least first partial connection device has a hardness of 30 HV to 60 HV; and the second partial connection device has a hardness of 50 HV to 90 HV.

5. The power electronic switching device, according to claim 1, wherein:

at least one of the first and second partial connection devices is further comprised of at least one of copper, aluminum, a copper alloy, an aluminum alloy, and a copper-aluminum alloy.

6. The power electronic switching device, according to claim 1, wherein:

at least one of the first and second partial connection devices further includes a slot-type recesses arranged on said switching device and is operable for one of a targeted current conduction and a current balancing.

7. A power semiconductor module, comprising:

an electronic switching device according to claim 1, further comprising:

a housing, wherein the second partial connection device projects through a recess in the housing; and where the second contact device is arranged.

8. The power semiconductor module, according to claim 7, wherein:

the power semiconductor module has a baseplate, upon which the substrate is arranged; and the substrate is enclosed by the housing.

9. The power semiconductor module, according to claim 7, wherein:

the power semiconductor module is configured for arrangement on a cooling system, and the substrate is enclosed by the housing.

* * * * *